United States Patent
Van Nieuwenburg

(10) Patent No.: US 7,529,535 B2
(45) Date of Patent: May 5, 2009

(54) CARRIER RECOVERY BASED DEMODULATION

(75) Inventor: Johannes Van Nieuwenburg, Eindhoven (NL)

(73) Assignee: NVP B.V., Eindhoven (NL)

( * ) Notice: Subject to any disclaimer, the term of this patent is extended or adjusted under 35 U.S.C. 154(b) by 40 days.

(21) Appl. No.: 10/555,269

(22) PCT Filed: Apr. 29, 2004

(86) PCT No.: PCT/IB2004/050553

§ 371 (c)(1),
(2), (4) Date: Nov. 1, 2005

(87) PCT Pub. No.: WO2004/100537

PCT Pub. Date: Nov. 18, 2004

(65) Prior Publication Data

US 2006/0232330 A1    Oct. 19, 2006

(30) Foreign Application Priority Data

May 5, 2003    (EP) ................................ 03101244

(51) Int. Cl.
*H04B 1/16*    (2006.01)
*H04L 27/00*    (2006.01)

(52) U.S. Cl. .................. 455/337; 375/324; 348/726

(58) Field of Classification Search .................. 455/337, 455/339, 334; 348/725, 726, 727; 375/324, 375/340, 727
See application file for complete search history.

(56) References Cited

U.S. PATENT DOCUMENTS

| | | | | |
|---|---|---|---|---|
| 4,177,430 A | * | 12/1979 | Paul | 455/306 |
| 4,272,845 A | * | 6/1981 | Fiumani | 375/293 |
| 4,933,767 A | * | 6/1990 | Hyakutake | 348/735 |
| 4,994,754 A | * | 2/1991 | Ohta | 329/318 |
| 5,103,295 A | * | 4/1992 | Uwabata et al. | 348/556 |
| 6,433,835 B1 | * | 8/2002 | Hartson et al. | 348/608 |
| 6,690,735 B1 | * | 2/2004 | Maddiotto et al. | 375/260 |

* cited by examiner

*Primary Examiner*—Quochien B Vuong

(57) ABSTRACT

A demodulator which is arranged to demodulate a first signal with the aid of a second signal, comprises a first bandpass (30) filter arranged to recover the first signal (36) from a received signal (10) and a second bandpass filter (32) arranged to recover the second signal (30) from the received signal (10). Wherein the passband of the second bandpass filter (32) is substantially narrower than the passband of the first bandpass filter (30).

11 Claims, 4 Drawing Sheets

CARRIER RECOVERY BASED DEMODULATION

The present invention relates to a demodulator. The invention further relates to an apparatus using such a demodulator and to a method for demodulating. More particularly, the present invention relates to demodulators based on carrier recovery such as demodulators for TV-IF signals, radio-IF and any other broadband IF system that make use of a recovered signal such as a carrier signal or a center frequency signal for the demodulation.

Demodulators that are based on carrier recovery are generally known in the art These demodulators comprise a single bandpass filter to simultaneously recover the carrier and the information signal from a received input signal. Such a demodulator is known from Taub-Schilling second edition, ISBN: 0-07-100313-4 on page 347, FIG. 8.1-A.

To this end, the demodulator is arranged to demodulate a first signal with the aid of a second signal, the demodulator comprising:
 a first bandpass filter arranged to recover the first signal from a received signal; and
 a second bandpass filter arranged to recover the second signal from the received signal;
 in which the passband of the second bandpass filter is substantially narrower than the passband of the first bandpass filter.

The invention is based on the insight that the use of a single bandpass filter for the recovery of the first and second signals, may lead to an attenuation of at least 6 dB of the second signal due to the nyquist slope of the single bandpass filter. This may lead to an unreliable recovery of the second signal, which is particularly problematic during poor receiving conditions. According to the present invention, the second signal for example a carrier signal or a center frequency signal can be recovered by using an additional bandpass filter having a narrow passband which is designed to recover only the second signal whilst rejecting the surrounding noise for as much as possible. The invention therefore provides two advantages. First of all the 6 dB attenuation of the second signal can be avoided. And second, due to the rejection of the surrounding noise, the Signal to Noise Ratio can even further be improved. Obviously, the principle of noise rejection is generally applicable and will therefore provide the benefit of improving the Signal to Noise Ratio even for demodulators that do not suffer from the Nyquist slope.

In an embodiment according to the present invention the demodulator comprises compensation means for minimizing a phase difference between the recovered first signal and the recovered second signal. These phase differences may result in an impaired demodulation of the first signal and they are caused by differences in propagation delay between the first and second bandpass filter.

In a further embodiment according to the present invention, the compensation means comprises a delay element that is arranged to delay the recovered first signal. Herewith, the total delay of the first signal through the first band pass filter and the delay element equals the delay of the second signal through the second bandpass filter.

In an other embodiment according to the present invention the compensation means comprises a phase shifter that is arranged to shift a phase of the recovered second signal, the phase shift being dependent upon the phase difference between a reference signal and the recovered second signal. This embodiment has the advantage that it provides a dynamic compensation of the phase differences which is not aimed at a specific combination of used bandpass filters. Obviously, this makes the solution a very flexible one. An embodiment of the phase shifter can be found on page 120 of: "Phaselock Techniques" by Floyd M. Gardner, $2^{nd}$ edition, Wiley & Sons, Inc. ISBN 0-471-04294-3.

In an embodiment according to the present invention, the compensation means comprises a selector that is arranged to select the reference signal from at least two reference sources. This allows selection of a suitable source for providing the reference signal.

In an embodiment according to the present invention the selector is a programmable selector. This has the advantage that the demodulator can, depending on its operational state automatically select the most convenient or reliable source for providing the reference signal.

In another embodiment according to the present invention one of the at least two sources is an image of a demodulated first signal which is stored in memory means. By using an image of the demodulated first signal instead of the demodulated first signal, the demodulation is no longer being disturbed by the presence of noise in the demodulated signal when it is fed back to the phase shifter 50.

In an embodiment according to the present invention the memory means comprises an analogue to digital converter arranged to provide a digital image of the demodulated first signal which allows for a convenient storage of the image in a digital format.

In an embodiment according to the present invention, the demodulator further comprises a phase locked loop for stabilizing the recovered second signal for further improving the quality of the demodulation.

In an other embodiment according the present invention, the second recovered signal is used for frequency down converting a third signal such as a further carrier signal. This embodiment is particularly suited for TV-IF systems wherein the third signal can be a sound carrier.

These and other aspects of the present invention will be elucidated further by means of the following drawings.

Figure 1:
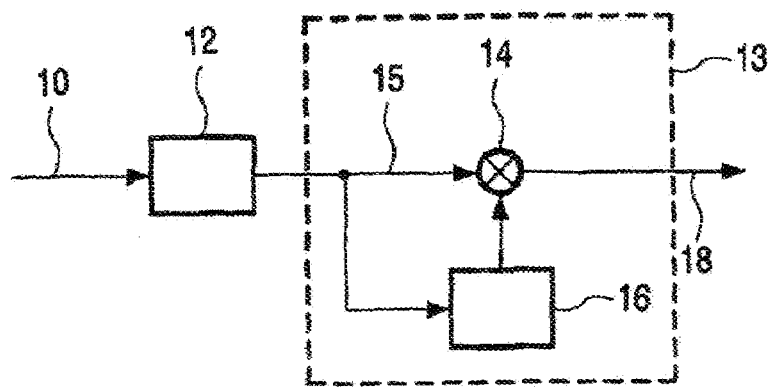
FIG. 1 shows an embodiment of a demodulator according to the prior art.

FIG. 1 shows a demodulator according to the prior art. Shown is a single bandpass filter 12 for filtering the received signal 10. The filtered signal 15 comprises both the recovered first and second signal which by means of example represent an information signal and a carrier signal. In FIG. 1 the information signal is demodulated in module 13 comprising a mixer 14 and a PLL 16 which is designed to lock onto the frequency of the carrier signal.

Figure 2:
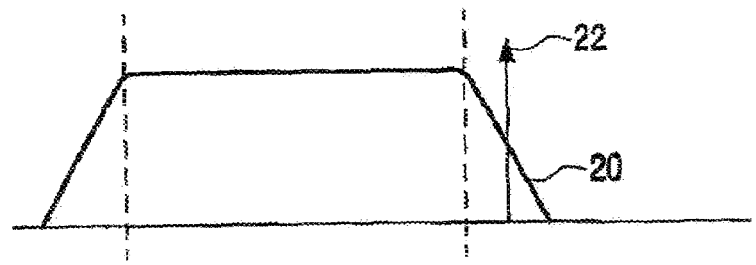
FIG. 2 shows the nyquist slope of a bandpass filter.

FIG. 2 shows the filter characteristics of bandpass filter 12 in more detail. Shown is a second signal 20 which falls within the nyquist slope 22 of the filter. This will attenuate the second signal approximately 6 dB and will therefore hamper demodulation of the first signal particularly if the received signal 10 has a poor Signal to Noise Ratio.

Figure 3:
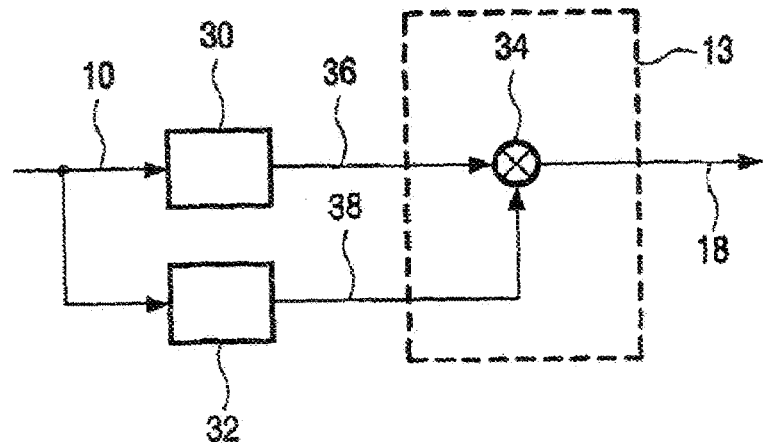
FIG. 3 shows an embodiment of a demodulator according to present invention.

FIG. 3 shows a demodulator according to the present invention comprising bandpass filter 30 for recovering the first signal 36. The demodulator further comprises bandpass filter 32 for recovering the second signal 38. By means of example the first signal 36 represents an information signal comprising the information that needs to be demodulated whilst the second signal 38 represents a carrier signal. The passband of filter 32 is substantially narrower than the passband of filter 30. In addition the passband of filter 32 is designed to optimally recover the carrier signal 38. This means that the noise surrounding the carrier signal 38 is largely filtered out whilst the carrier signal itself is not attenuated by any Nyquist slope. This results in an improved carrier to noise ratio.

Figure 4:
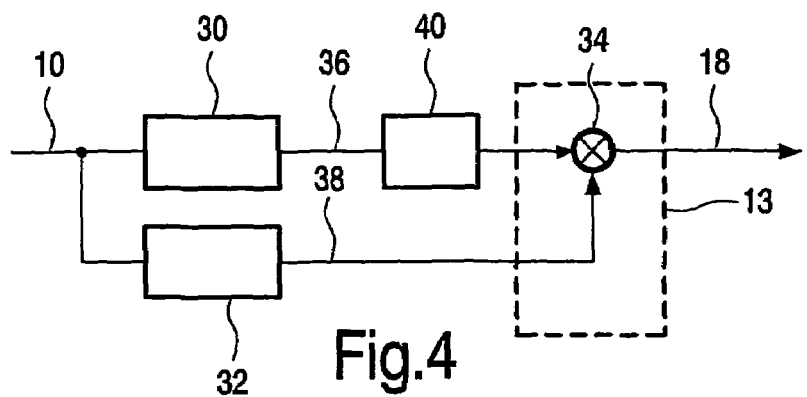
FIG. 4 shows an other embodiment of a demodulator according to the present invention wherein phase differences are compensated by using a delay element.

If however the propagation delay of filters 30 and 32 are not equal to each other, phase errors between the recovered information signal 36 and the recovered carrier signal 38 could occur. Obviously, this will have a deteriorating effect on the signal quality of the demodulated information signal. Therefore in FIG. 4, delay element 40 is added for delaying the information signal so that the difference in propagation delay between filters 30, 32 is compensated for.

Figure 5:
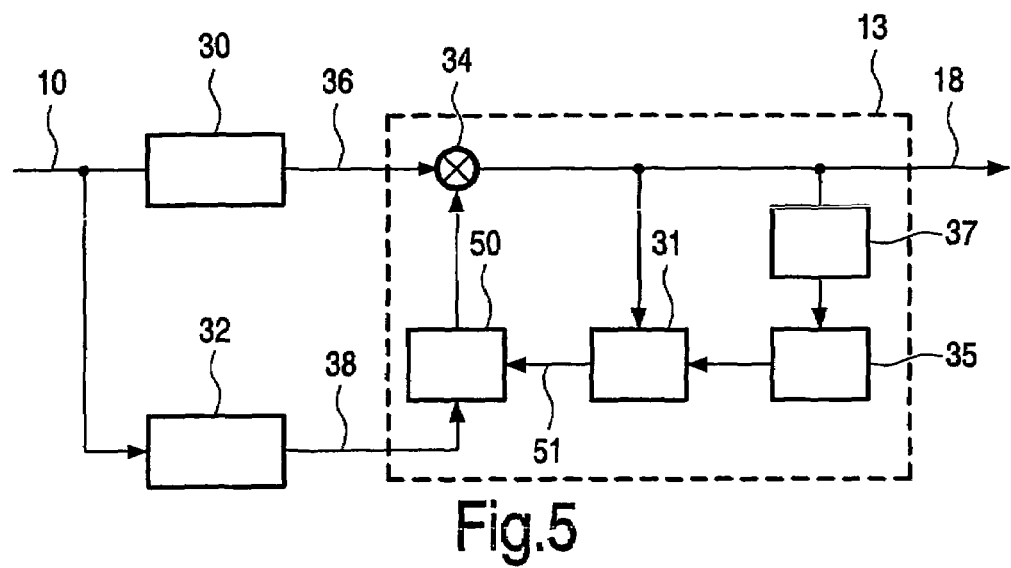
FIG. 5 shows a further embodiment of a demodulator according to the present invention wherein phase differences are compensated by using a phase shifter.

FIG. 5 shows an embodiment wherein the differences in the propagation delay between filters 30 and 32 are compensated by use of phase shifter. An embodiment of such a phase shifter can be found on page 120 of: "Phaselock Techniques" by Floyd M. Gardner, $2^{nd}$ edition, Wiley & Sons, Inc. ISBN 0-471-04294-3. The phase shift depends on the phase difference between recovered carrier signal 38 and reference signal 51. This reference signal 51 can be the demodulated information signal 18 or an image of this demodulated information signal. The image of the information signal 18 is averaged out by means of low pass filter 37 before it is stored in stored in memory means 35. The stored image can be static, provided that the stored image is reliable. The main benefit of using a stored image, is that in this way the demodulation is no longer disturbed by the presence of noise which may be comprised in the demodulated information signal 18 when it is fed back to phase shifter 50. The embodiment is further equipped with programmable selector 31 for selecting either the demodulated information signal 18 or the image of the demodulated signal 18 as the source for providing the reference signal 51. Herewith, the demodulator can automatically select the most suitable source for providing the reference signal 51 for example during startup. In this case the selector 31 would select the demodulated signal 18. At the same time however, memory 35 will store an averaged image of the demodulated signal 18. Once a reliable image is stored, the selector 31 may select memory means 35 for providing the reference signal 51. Finally, this embodiment is particularly advantageous in that it provides an automatic and adaptive compensation of the phase differences that are caused by the differences in propagation delay between filters 30 and 32.

Figure 6:
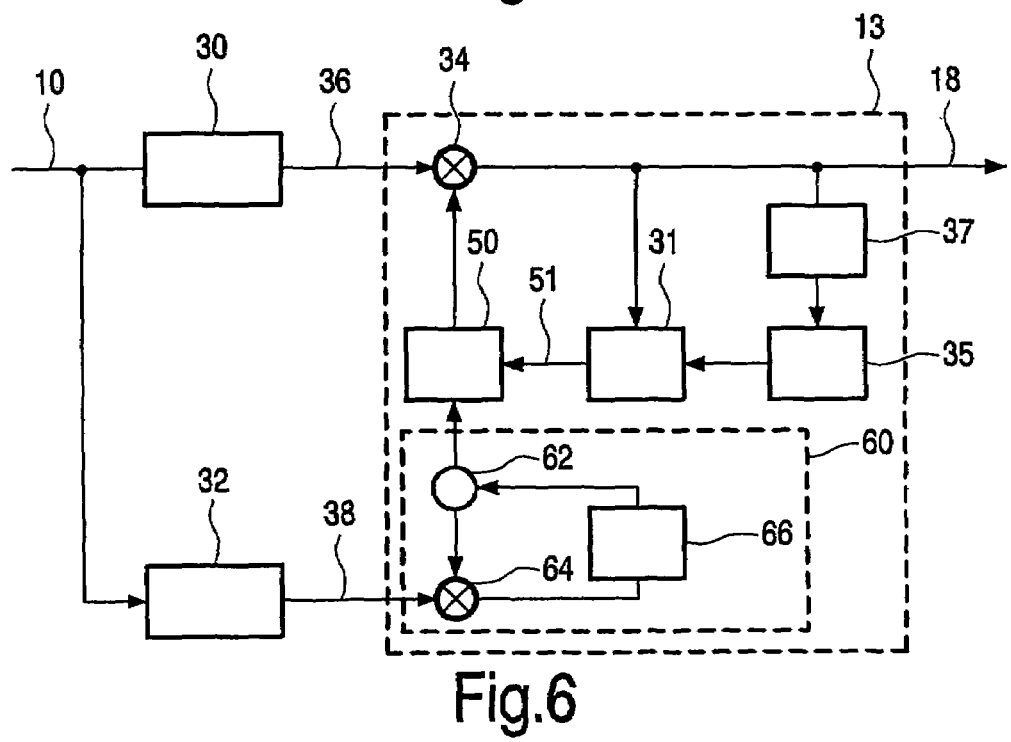
FIG. 6 shows a further embodiment of a demodulator according to the present invention wherein the recovered second signal such as a carrier signal is stabilized using a Phase Locked Loop.

FIG. 6 shows a further embodiment according to the present invention which is for example used in TV-IF systems. In FIG. 6, the carrier signal 38 is stabilized using Phase Locked Loop 60 which comprises a single oscillator such as a Voltage Controlled Oscillator (VCO) 62. The Phase Locked Loop 60 further comprises mixer 64 and low pass filter 66. The VCO 62 will oscillate at the frequency of the recovered carrier signal. In this embodiment, the mixing signals for mixers 34 and 64 are generated using single oscillator 62 thereby achieving considerable power and avoiding deteriorating effects like for example oscillator pulling, which occurs when two oscillators are influencing each other. Therefore this embodiment is particularly suited for integration in an integrated circuit.

Figure 7:
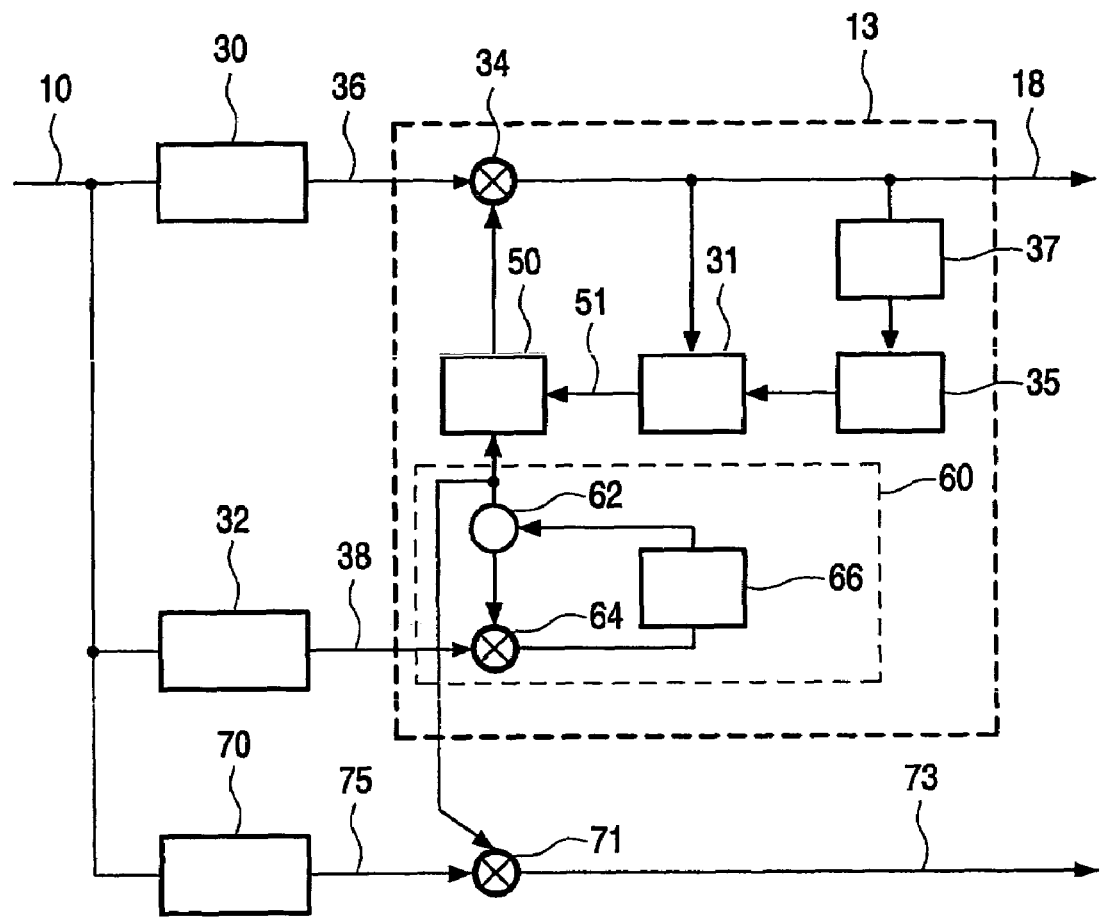
FIG. 7 shows an embodiment according to the present invention wherein the recovered second signal such as carrier signal is used to down-mix a further signal.

FIG. 7 shows an other embodiment according to the present invention wherein the frequency of the VCO 62 is used to down-convert a second carrier signal 75 which is also recovered from received signal 10 by means of second bandpass filter 70. The recovered carrier signal is down-converted using mixer 71. This embodiment can advantageously be used in TV-IF systems wherein the second carrier could be a sound carrier. Because of the absence of a nyquist slope, the embodiment does not suffer from AM to PM conversion i.e. there are no disturbing cross-talk effects between the video audio signals.

Figure 8:
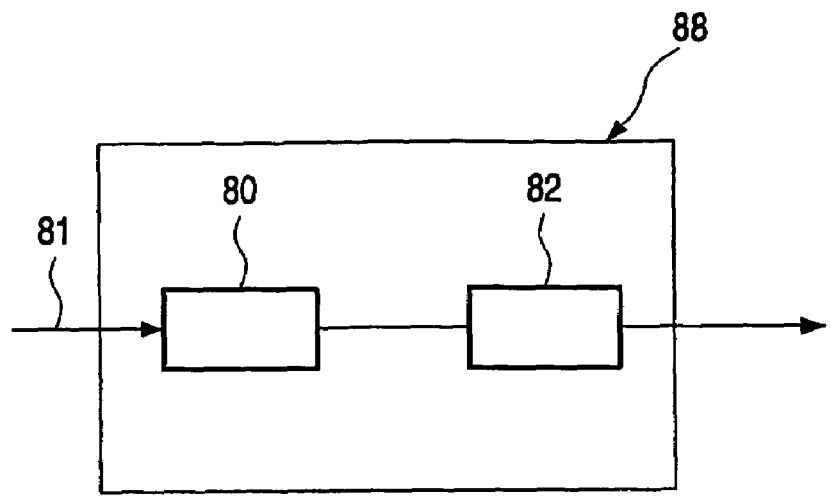
FIG. 8 shows an apparatus comprising a demodulator according to the present invention.

FIG. 8 shows an apparatus 88 comprising a RF tuner 80 arranged to receive a particular RF signal 81 and a demodulator 82 for demodulating the received signal 81.

Figure 9:
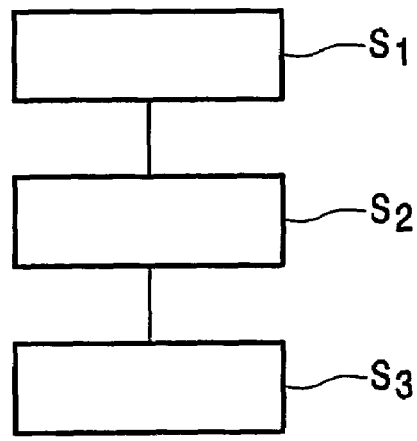
FIG. 9 shows a flow chart for a method for carrier recovery based demodulation according to the present invention.

FIG. 9 shows a flow chart for carrier recovery based demodulation according to the present invention. In the first step S1, a received signal is bandpass filtered by means of a first bandpass filter for recovering the first signal from the received signal. In the second step S2, the received signal is bandpass filtered by means of a second bandpass filter for recovering the second signal from the received signal. Finally, in the third step S3, the first signal is demodulated by means of the second signal.

It should be noted that the above-mentioned embodiments illustrate rather than limit the invention, and that those skilled in the art will be able to design many alternative embodiments without departing from the scope of the appended claims. All signal processing shown in the above embodiments can be carried in the analogue domain and the digital domain. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. Demodulator arranged to demodulate a first signal with the aid of a second signal, the demodulator comprising:
   a first bandpass filter arranged to recover the first signal from a received signal;
   a second bandpass filter arranged to recover the second signal from a received signal, the passband of the second bandpass filter being substantially narrower than the passband of the first bandpass filter; and
   compensation means for compensating phase error between the recovered first and second signals, the compensation means comprising a phase shifter that is arranged to shift a phase of the recovered first signal, the phase shift being dependent upon the phase difference between the recovered second signal and a reference signal, the compensation means further comprising a selector that is arranged to select the reference signal from at least two sources.

2. Demodulator according to claim 1, wherein the compensation means comprises a delay element that is arranged to delay the recovered first signal.

3. Demodulator according to claim 1, wherein the selector is a programmable selector.

4. Demodulator according to claim 1, wherein one of the at least two sources is a demodulated first signal.

5. Demodulator according to claim 1, wherein one of the at least two source is an image of a demodulated first signal which is stored in memory means.

6. Demodulator according to claim 5 wherein, the memory means comprises an analogue to digital converter arranged to provide a digital image of the demodulated first signal.

7. Demodulator according to claim 1 wherein the demodulator further comprises a phase locked loop for stabilizing the recovered second signal.

8. Demodulator according to claim 1 wherein the recovered second signal is used for frequency down converting at least a third signal.

9. Demodulator according to claim 1 further comprising a mixer connected to the first and second bandpass filters to mix the first signal and the second signal.

10. Apparatus comprising a demodulator, the demodulator being arranged to demodulate a first signal with the aid of a second signal, the demodulator comprising:
  a first bandpass filter arranged to recover the first signal from a received signal;
  a second bandpass filter arranged to recover the second signal from the received signal, the passband of the second bandpass filter being substantially narrower than the passband of the first bandpass filter; and
  compensation means for compensating phase error between the recovered first and second signals, the compensation means comprising a phase shifter that is arranged to shift a phase of the recovered first signal, the phase shift being dependent upon the phase difference between the recovered second signal and a reference signal, the compensation means further comprising a selector that is arranged to select the reference signal from at least two sources.

11. Method for demodulating a first signal with the aid of a second signal the method comprising the steps of:
  using a first bandpass filter for recovering the first signal from a received signal;
  using a second bandpass filter having a substantially narrower passband than the first bandpass filter, for recovering the second signal from the received signal; and
  compensating phase error between the recovered first and second signals, the compensating including shifting a phase of the recovered first signal, the shifting being dependent upon the phase difference between the recovered second signal and a reference signal, the compensating further including selecting the reference signal from at least two sources.

* * * * *